United States Patent [19]

Goutzoulis et al.

[11] Patent Number: 5,297,273
[45] Date of Patent: Mar. 22, 1994

[54] SYSTEM FOR OPTICALLY SPLITTING HIGH-SPEED DIGITAL SIGNALS USING CASCADING TREE-TYPE CONFIGURATION WHEREIN THE NUMBER OF SUCCESSIVE LEVEL OF CASCADING INCREASE BY A FACTOR OF TWO

[75] Inventors: Anastasios P. Goutzoulis, Pittsburgh; Peter J. Chantry, Churchill Boro; Tom Henningsen, Monroeville, all of Pa.

[73] Assignee: Westinghouse Electric Corp., Pittsburgh, Pa.

[21] Appl. No.: 574,976
[22] Filed: Aug. 30, 1990
[51] Int. Cl.$^5$ ............................................. G06F 3/00
[52] U.S. Cl. ................................. 395/500; 364/238; 364/DIG. 1; 364/713; 359/115
[58] Field of Search ............... 395/800, 500, 275; 371/4; 324/4, 97, 158 R; 364/713; 359/115; 358/138; 380/46; 455/6.1

[56] References Cited

U.S. PATENT DOCUMENTS

| | | | |
|---|---|---|---|
| 4,240,750 | 12/1980 | Kurtz et al. | 356/394 |
| 4,315,166 | 2/1982 | Hughes | 377/33 |
| 4,875,006 | 10/1989 | Henley et al. | 324/97 |
| 4,928,310 | 5/1990 | Goutzoulis et al. | 380/46 |
| 5,033,016 | 7/1991 | Falk et al. | 364/713 |
| 5,042,086 | 8/1991 | Cole et al. | 359/115 |
| 5,043,909 | 8/1991 | Meyers et al. | 364/484 |
| 5,060,302 | 10/1991 | Grimes | 359/135 |
| 5,062,059 | 10/1991 | Youngblood et al. | 395/275 |
| 5,097,205 | 3/1992 | Toyoda | 324/158 R |
| 5,097,331 | 3/1992 | Chen et al. | 358/138 |
| 5,105,380 | 4/1992 | Owechko | 364/825 |
| 5,142,690 | 8/1992 | McMullan et al. | 455/6.1 |

OTHER PUBLICATIONS

T. R. Gheewala, "*Requirements and Interim Solutions For High-Speed Testing of GaAs ICs*", CH 2181–4/85/0-00–0143, GaAs IC Symposium, 1985, pp. 143–146.
J. McLeod, "*Can Testers Catch Up With Complex Chips*" Electronics, Jan. 22, 1987, pp. 49–52.
B. Milne, "*ASIC Verification Systems Flight To Measure Up*", Electronic Design, Sep. 8, 1988, pp. 63–70.
W. Davenport, P. J. Hamilton, L. Pengue D. Perkins "*A GaAs Gate Array Layout Tests ASIC Chips Up to 800 MHZ*", Electronic Design, Jan. 21, 1988 pp. 93–95.
D. J. Fouts, J. M. Johnson, S. E. Butner, S. I. Long, "*System Architecture Of A Gallium Arsenide One-Gigahertz Digital IC Tester*", Computer, May, 1987, pp. 58–70.
J. McLeod, "*ASIC Verification: Chasing A Moving Target*", Electronics, Nov. 28, 1987, pp. 79–85.
B. Milne, "*HP Claims Its IC Tester Runs Faster Than Any Other*", Electronics, Dec. 18, 1986, p. 129.
B. Harvey, "*Prototype Verifier Sets Its Sights On The Latest VHSIC Devices*", Electronic Design, Nov. 27, 1987, pp. 49–52.
"*Tektronix Testers Toil at 200 MHz*".
"*Dataprobe Creator Builds 1.2 GHz Test Systems*".
B. Harvey, "*Build A Circuit-Board Tester With Your PC*", Electronic Design, Feb. 9, 1989, pp. 81–84.
M. A. Fischetti, "*Whatever Happened to SOS ICs*", IEEE Spectrum, Mar. 1986, p. 24.
I. Stumbler, "*Program Will Improve Methods of Manufacture for VHSIC Devices*".
W. M. Ribble, "*Choosing An IC Tester*", Electronics Week, Mar. 25, 1985, pp. 61–64.
R. Wallace "*Air Force Seeking VHSIC Testers Replacement for GR18 Tester*" Electronic Engineering Times, Sep. 1987.
"*Pattern Generator Stimulates 2-Gb/5 GaAs and ECL IGs*" Microwaves & RF, Aug. 1989, p. 169.
"*How Genrad's New Tester Copes with VHSIC Chips*" Electronics, May 19, 1986, pp. 49–52.

*Primary Examiner*—Alyssa H. Bowler
*Assistant Examiner*—Meng-Ai T. An
*Attorney, Agent, or Firm*—Michael L. Dever

[57] ABSTRACT

An optical architecture for receiving and slowing down high-speed data for high-speed digital testing applications is provided in which an input generating means transmits high-speed input test vectors to an apparatus under testing. In response, the apparatus under testing generates output test vectors. These high speed output test vectors are converted to slow-speed data signals by optically demultiplexing the high-speed vectors into high-speed parallel data signals and then expanding the parallel data signals to for slow-speed data signals. The slow-speed data signals are then compared with slow-speed reference vectors on a personal computer to determine whether the apparatus under testing is in error for any of its output channels.

24 Claims, 3 Drawing Sheets

SYSTEM FOR OPTICALLY SPLITTING HIGH-SPEED DIGITAL SIGNALS USING CASCADING TREE-TYPE CONFIGURATION WHEREIN THE NUMBER OF SUCCESSIVE LEVEL OF CASCADING INCREASE BY A FACTOR OF TWO

BACKGROUND OF THE INVENTION

1. Field of the Invention

This invention relates to the field of digital testing apparatus for analyzing high speed data.

2. Description of the Prior Art

The objective of digital testing is to determine whether for a given input signal (usually called "input test vector" since it is a set of parallel input bits) the output value (or state) of the device under test (DUT) is in error for any of its output channels. The test must determine the location of the error (i.e., specific bit and state) and the nature of the error (i.e., "1" instead of "0" or vice versa). State-of-the-art commercially available digital testers can test silicon based integrated circuits at speeds of the order of 200 MHz. Digital testing at 1-2 GHz rates as required for LSI GaAs integrated circuits or high-speed superconductive devices, however, is impossible with any known technology. This is because of the lack of a established high-speed technology that is capable of satisfying some rather stringent test requirements which include receiving the DUT's high-speed output data, transferring the data to the tester while avoiding transmission line effects, and converting the high-speed data to low-speed data so that they can be compared with the expected reference data which are stored in a conventional low-speed memory.

A typical 100 MHz clock digital tester provides data pulsewidths of 10 ns with combined rise and fall times of about 30% the pulsewidth or 1.5 ns each. The timing resolution or accuracy with which the edges of the pulses are applied to the inputs of the DUT is typically 3-5% of the pulsewidth or about 300 ps. This requirement arises because of the need to verify the predicted propagation delay through the DUT. Thus the tester must provide input test vectors whose elements (or bits) are positioned in time as accurately as possible. The tester skew (defined as the maximum timing error of a tester that measures the arrival of a pulse simultaneously applied to every pin of the tester's input) is typically 10% of the pulsewidth or 1 ns. By extrapolating these guidelines, the specifications of a 1.5 GHz (RZ) digital tester can be determined. The width of each bit is 666 ps which implies that square waveforms of about 330 ps must be generated having rise and fall times of 50 ps. For 5% time resolution, the tester must be able to place the pulse edges as accurately as 35 ps. The system skew figure must be kept to less than 66 ps.

In a general high-speed testing scenario, a demultiplexer (DMUX) or serial-to-parallel converter is used to slow down the high-speed output DUT data so that they can be tested or stored using conventional low speed electronics. The highest speed DMUX device can operate at 1.5 G bit/s data rates and has a rise and fall time of 150 ps. This rise and fall time speed exceeds the specifications of the 1.5 GHz tester by a factor of 2. Consequently, there is a need for a digital testing device capable of testing high-speed data in excess of 1 GHz.

SUMMARY OF THE INVENTION

We have invented an apparatus for conducting high speed digital testing of a DUT in which an input signal generating means transmits high-speed input test vectors to the DUT. In response, the DUT generates high-speed output test vectors. The high-speed output test vectors are then converted to slow-speed data signals. These slow-speed data signals ar compared with slow-speed reference vectors to determine whether the DUT is in error for any of its output channels.

We utilize an optical demultiplexing means for splitting the high-speed output test vectors into a number of high-speed parallel data signals. We then convert the parallel high-speed data signals into slow-speed data signals.

We use two different architectures to optically demultiplex the high-speed output vectors. In the first architecture, we use a fiber optic splitter to split the high-speed output vector into parallel high-speed data signals. Avalanche photodiodes are connected to each parallel high-speed data signal and drive AND gates. The other input of the AND gate is driven by a gating signal, the pulse width of which is equal to ½ the pulsewidth of the high speed output vectors. The gating signal is delayed between any two successive AND gates by a delay equal to the bitwidth of the high-speed output vectors.

In the second architecture, we provide a plurality of integrated optic directional coupling (IODC) structures arranged in a cascading tree-type configuration. The number of IODC structures in each successive level of the cascading arrangement increases by a factor of 2. A control signal is introduced into each IODC structure. The frequency of the control signal is equivalent to $f/2^i$ where f is the frequency of the high-speed output vector and i is the level of the IODC structure in the tree-type configuration.

By using optical techniques, all the high-speed data generation, demultiplexing, and interconnections are cascadable. All of these operations take place in the optical domain and no electronic processing is required in between them. Because none of these operations take place in the electronic domain, our high speed digital testing device can effectively test at multi-GHz rates.

DETAILED DESCRIPTION OF THE PREFERRED EMBODIMENT

Our invention can be embodied in two different architectures that are appropriate for receiving and slowing down the DUT's output data. The general idea of these architectures is to convert the high-speed output serial data from a single output pin on the DUT, into M parallel data, with speed reduced by a factor of M, so that they can be stored in a moderate speed parallel memory.

Figure 1:
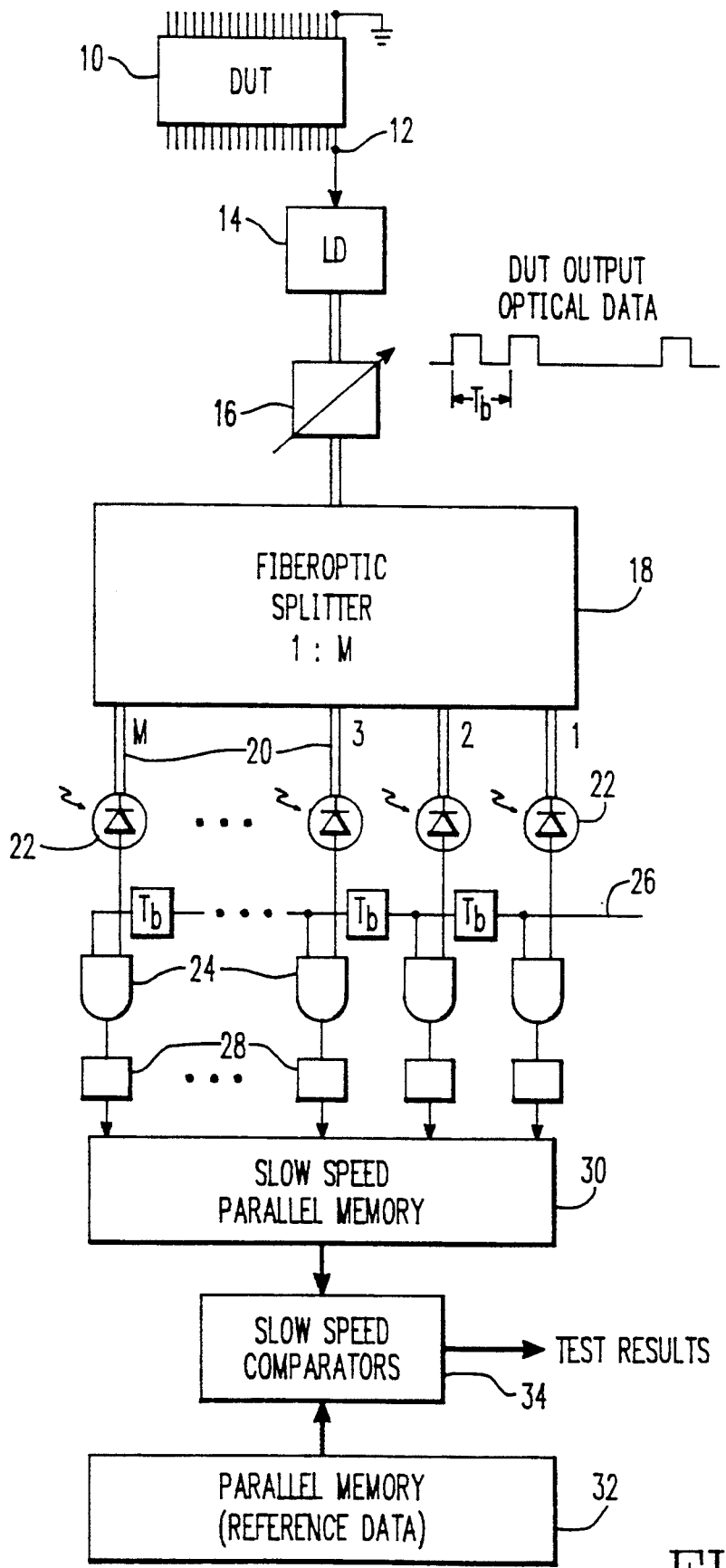
FIG. 1 is a schematic representation of a first presently preferred architecture of the high speed digital testing device of the present invention.

With reference to FIG. 1, the first architecture can be described as follows. The voltage generated at the output pin under test 12 of DUT 10 modulates the light intensity of a laser diode (LD) 14. The output of the laser diode 14 is coupled into an optical fiber which is then connected to an optical variable delay device 16 whose purpose is to compensate for possible output skew so that the timing through the rest of the system is appropriate. The output of the variable delay device 16 is then split into M channels via a fiber-optic 1:M splitter 18. The splitter's output fibers 20 are of the same length and thus the signals at the end of the fibers 20 are identical. The signals on the optical fibers 20 are read-out and converted into electrical signals via the use of optical photodiodes 22.

Figure 2:
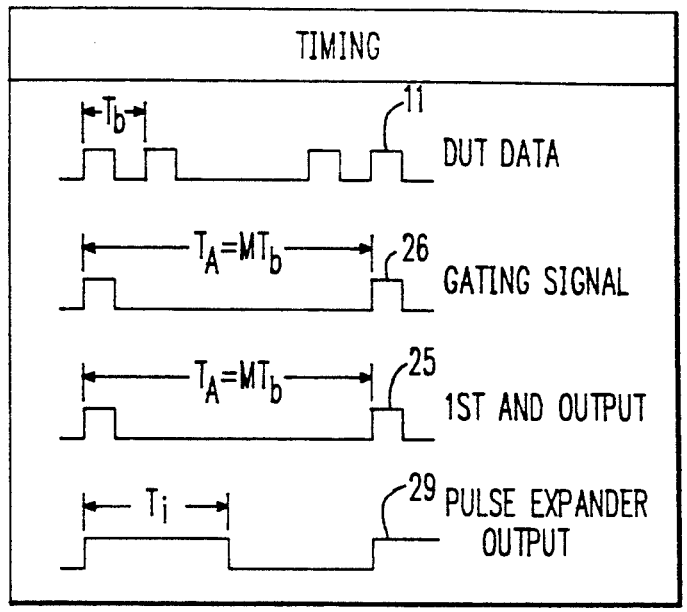
FIG. 2 is a schematic representation of the timing relations of the various signals in the device of FIG. 1.

The outputs of the photodiodes 22 drive one input of M GaAs AND-gates 24. The other input of each of the AND gates 24 is driven by a gating signal 26. With reference to FIG. 2, the gating signal 26 has a pulse-width of $T_b/2$ and a period of $T_A=MT_b$ where $T_b$ is the bitwidth of the DUT data signal 11. The gating signal 26 is delayed between two successive AND gates 24 by a delay equal to the bitwidth $T_b$ of the DUT 10. Under these conditions and for an M input-bit high-speed serial sequence, the output of the first AND gate 24 will consist of the first bit of the serial sequence followed by $M-1$ zeros, the output of the second AND gate 24 will consist of a zero followed by the second bit of the serial sequence which in turn is followed by $M-2$ zeros, the output of the third AND gate 24 will consist of two zeros followed by the third bit of the serial sequence which in turn is followed by $M-3$ zeros, and so forth until, the output of the Mth AND gate 24 will consist of $M-1$ zeros followed by the last bit (mth) of the input serial sequence. The first AND gate output signal 25 is shown on FIG. 2.

The combination of fiber-optic splitter 18, photodiodes 22, and AND gates 24, in conjunction with the properly synchronized gating signal 26, allow us to isolate each of the M input bits into a different channel. The variable delay device 16 is also needed in order to synchronize the DUT 10 data with the gating signal 26. One such variable delay device 16 is disclosed in application Ser. No. 07/572,835, filed on Aug. 27, 1990, now U.S. Pat. No. 5,066,088 and incorporated herein by reference.

Figure 5:
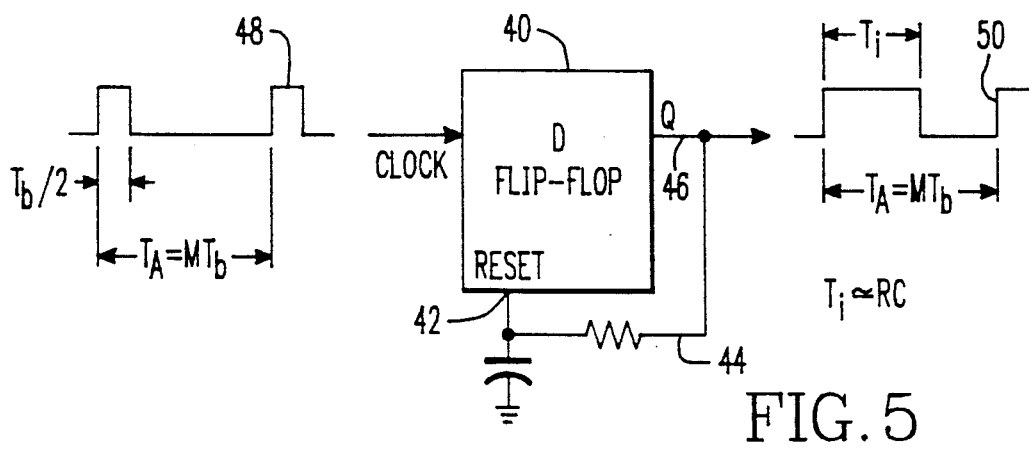
FIG. 5 is a schematic representation of a D Flip-Flop based high-to-low speed digital data electronic converter used in the device of FIGS. 1 and 3.

The next step is to transform the high-speed low duty cycle data present in each of the M output channels into slow-speed data which can be stored in a moderate or slow speed memory 30. To do this we use a pulse expander 28 to expand the bitwidth (from $T_b$ to $T_i$ as shown in pulse expander output signal 29 of FIG. 2) so that it is sufficiently long in order to be read by the memory 30. This can be achieved with a variety of one-shot multivibrator techniques, one of which is shown in FIG. 5. This technique uses a D flip-flop 40 with a reset 42 and an RC network 44 connected between the D flip-flop output 46 and the reset input 42. The RC constant is approximately equal to the desired bitwidth $T_i$. For a "hiqh" input signal $T_b$, the flip-flop's 40 output is maintained high (because of the RC) till it is reset, which occurs after time $T_j$. Thus by adjusting the RC constant we can expand the output pulses 46, effectively slowing down the data 50

The so-converted data 50 are then stored in an M-channel parallel memory 30. The next step is to compare the data of memory 30 with the reference data stored in another parallel memory 32. This can be achieved with slow speed comparators 34 under the control of a device such as a microprocessor.

This technique for digital testing offers many advantages. The proposed architecture is based on commercially available, well established optical and electronic technology, it is simple, practical and it can be easily implemented. The maximum speed is determined by the speed of the laser diode 14, photodiodes 22, AND gate 24, and Flip-Flop 40. Low cost, commercially available laser diodes 14 with speeds up to 12 GHz are available, such as the ORTEL 1515 B. Similarly, photodiodes 22 with speeds of over 12 GHz are also Commercially available, such as ORTEL 2515 B. State-of-the-art GaAs AND gates 24 can operate at about 2.5 GHz, such as Gigabit Logic's 10G003. Finally, GaAs flip-flops 40 with inputs of about 2.7 GHz are commercially available, such as Gigabit Logic's 10G021A. We can thus conclude that this technique is limited by the speed of the AND gates 24 and is appropriate for up to 2.5 GHz (RZ) testers. The speeds and number of channels of the proposed serial-to-parallel converter cannot be achieved with any prior art technology including GaAs devices. The speed could be increased, however, if cryogenic superconductive AND gates 24 and D flip-flops 40 are used.

The speed of the previously described architecture is limited by the speed of the available GaAs AND gates 24. To eliminate this problem we may perform the "bit sorting" electrooptically. Such sorting requires an optical single-pole/double throw (SPDT) switch. Such switches can be made out of commercially available integrated optic directional coupler structures (IODC).

Figure 4:
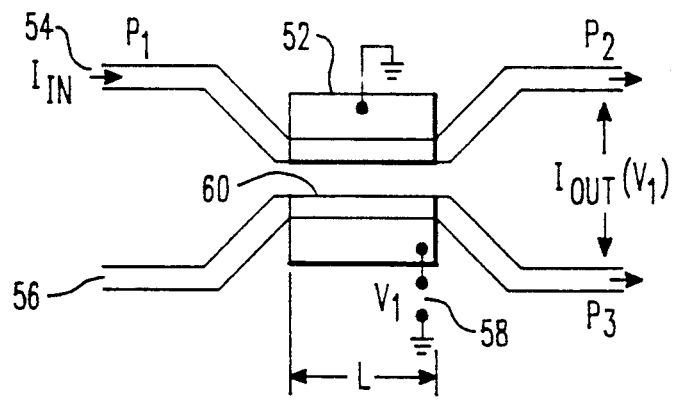
FIG. 4 is a schematic representation of an integrated optical directional coupler used in the device of FIG. 3.

As shown in FIG. 4, an IODC 52 consists of two parallel waveguides which synchronously exchange power over a uniform interaction length L. Complete crossover is achieved when the waveguides 54 and 56 are phase matched and when the interaction length L is an exact odd multiple of the coupling length. The coupling length is the minimum length required to obtain complete crossover of the light. A voltage 58 applied between the electrodes placed above each waveguide 54 and 56, creates an electrooptically induced phase mismatch. The phase mismatch destroys the harmonic synchronization and thus power exchange ceases. Thus, the presence or absence of the voltage 58 determines whether the light is switched from one waveguide to the other. Practical IODCs 52 require a second biasing electrode 60 in order to fine tune the appropriate phase mismatch and thus minimize the waveguide crosstalk. In almost all cases, the electrooptical devices can be tailored through proper electrode configuration so that their operating voltage 58 exactly matches that of the input drivers.

Figure 3:
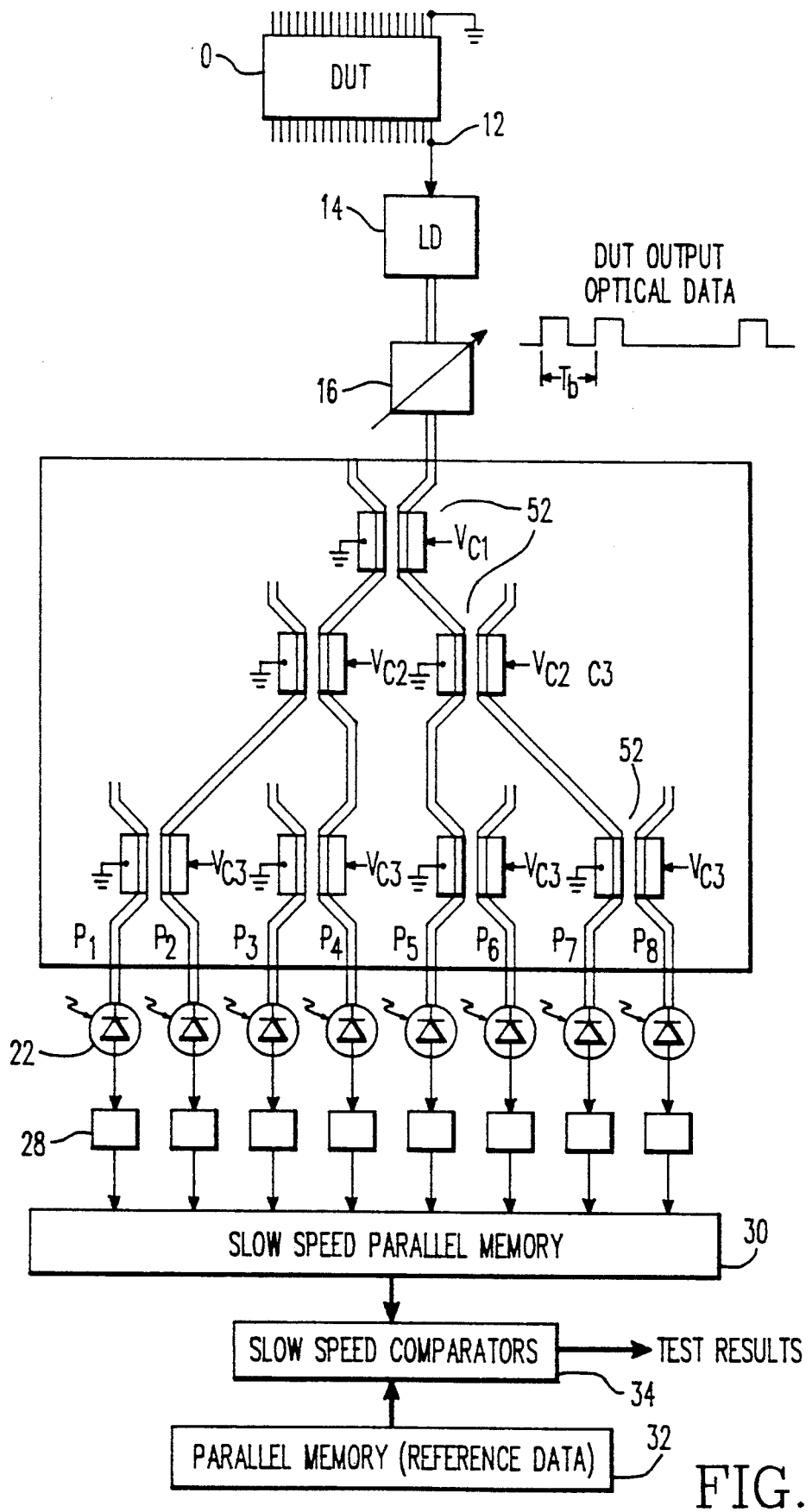
FIG. 3 is a schematic representation of a second presently preferred architecture of the high speed digital testing device of the present invention.

As shown in FIG. 3, by cascading IODCs 52 in a tree-type configuration we can implement the electrooptical equivalent of the GaAs AND gate switches and the fiber-optic splitter. As shown in FIG. 3, 7 IODCs 52 can be used to implement an electrooptical 1:8 serial-to-parallel converter whose purpose is to separate the high-speed optical serial data which come from a single pin 12 of the DUT 10.

Three control signals (all raised cosines) are needed in the configuration shown in FIG. 3: $V_{c1}$, $V_{c2}$, and $V_{c3}$. The first signal, $V_{c1}$, has a frequency equal to half of that of the DUT 10. Its purpose is to send "odd" numbered bits to ports $P_1-P_4$ and "even" numbered bits to ports $P_5-P_8$. The $V_{c2}$ signal has one quarter the frequency of the DUT 10, and its purpose is to separate the bits even further, by sending every other "odd" ("even") bit to ports $P_1-P_2$ ($P_5-P_6$). Finally, the $V_{c3}$ signal has a frequency that equals an eighth of the DUT's 10 frequency and assigns the previously separated bits into the final ports. The frequency of each of the $V_{ci}$ signals can be determined by the relationship $f/2^i$ where f is the frequency of DUT 10 and i is the level of the IODC structure in the tree type configuration.

Good synchronization is required between the $V_{ci}$ signals and the optical input signals. Thus, the $V_{ci}$ data must be derived from a master clock, and a variable delay 16 must be used prior to the tree switches.

As in the previous architecture, the so-sorted data must be detected via the use of photodiodes 22. The outputs of the photodiodes 22 are then subject to pulse expansion 26 which will allow the data to be written in the memory 28, and subsequently tested.

The major advantage of this architecture is that the GaAs-based electronic sorting is replaced by optoelectronic tree-type switches which allow operation at much higher speeds. IODC 52 devices operating at 4 GHz at 4V are commercially available and devices used for 8-Gbit/s data transmission are near commercial development. Higher frequency operation is also possible since experimental electrooptic devices with up to 40 GHz operation have been demonstrated.

In the foregoing specification certain preferred practices and embodiments of this invention have been set out, however, it will be understood that the invention may be otherwise embodied within the scope of the following claims.

We claim:

1. An apparatus for testing high speed digital signals comprising:
   a) a signal generating means which transmits high-speed digital signals having a determined bitwidth;
   b) means for optically splitting said high-speed signals into a plurality of high-speed parallel data signals, said optical splitting means comprising optical demultiplexing means for splitting said high-speed signal into a plurality of high-speed parallel data signals, said optical demultiplexing means comprising a plurality of integrated optic directional coupling structures arranged to receive said high-speed signal and provide a plurality of parallel high-speed data signals, said plurality of integrated optic directional coupling structures being provided in a cascading tree-type configuration in which the plurality of integrated optic directional coupling structures in each successive level increases by a factor of 2; and
   c) means to convert said plurality of parallel high-speed data signals into a plurality of slow-speed data signals.

2. The apparatus of claim 1 further comprising comparator means for comparing said slow-speed data signals with slow-speed reference data.

3. The apparatus of claim 1 wherein a control signal is introduced into each of said plurality of integrated optic directional coupling structures, said control signal having a frequency equivalent to $f/2^i$, where f is the frequency of the high-speed data signal and i is the level of the integrated optic directional coupling structure in the tree-type configuration.

4. The apparatus of claim 3 further comprising:
   a) a first slow speed parallel memory which stores the slow speed data signals in a plurality of channels;
   b) a second slow speed parallel memory which stores reference data; and
   c) a slow speed microprocessor-controlled comparator which compares the first slow speed parallel memory with the second slow speed parallel memory.

5. The apparatus of claim 1 wherein said optical demultiplexing means comprises:
   a) a fiber optic splitter which splits said high-speed signal into a plurality of parallel high-speed data signals having a first pulsewidth;
   b) a plurality of photodiodes, one of said plurality of photodiodes connected to each of said parallel high-speed data signals; and
   c) a plurality of AND gates, one of said plurality of AND gates driven by the output of each of said plurality of photodiodes, the other input of each of said plurality of AND gates being driven by a gating signal having a second pulsewidth, wherein the pulsewidth of the gating signal is equal to ½ the pulsewidth of the high speed data signals.

6. The apparatus of claim 5 further comprising comparator means for comparing said slow-speed data signals with slow-speed reference data.

7. The apparatus of claim 5 wherein the gating signal is delayed between any two successive AND gates by a delay equal to the bitwidth of the high-speed signal.

8. The apparatus of claim 7 further comprising:
   a) a first slow speed parallel memory which stores the slow speed data signals in a plurality of channels;
   b) a second slow speed parallel memory which stores reference data; and
   c) a slow speed microprocessor-controlled comparator which compares the first slow speed parallel memory with the second slow speed parallel memory.

9. The apparatus of claim 1 wherein said converting means comprises means to expand the bitwidth of each of said plurality of parallel high-speed data signals to produce a plurality of parallel slow-speed signals, said width of parallel slow-speed signals having a desired bitwidth.

10. The apparatus of claim 9 wherein said means to expand the bitwidth comprises a D flip-flop with a reset and an RC network connected between an output of said D flip-flop and an input of said reset, said RC network having an RC constant, wherein the RC constant is approximately equal to the desired bitwidth of said plurality of parallel slow-speed signals.

11. The apparatus of claim 10 further comprising:
   a) a first slow speed parallel memory which stores the slow speed data signals in a plurality of channels;
   b) a second slow speed parallel memory which stores reference data; and
   c) a slow speed microprocessor-controlled comparator which compares the first slow speed parallel memory with the second slow speed parallel memory.

12. The apparatus of claim 1 further comprising:
   a) a first slow speed parallel memory which stores the slow speed data signals in a plurality of channels;
   b) a second slow speed parallel memory which stores reference data; and c) a slow speed microprocessor-controlled comparator which compares the first slow speed parallel memory with the second slow speed parallel memory.

13. A method for processing high speed digital signals comprising the steps of:
   a) generating and transmitting a high-speed digital signal having a determined bitwidth;
   b) optically splitting said high-speed signal into a plurality of high-speed parallel data signals by optically demultiplexing said high-speed signal into a plurality of high-speed parallel data signals,
   arranging a plurality of integrated optic directional coupling structures to receive said high-speed signal and provide a plurality of parallel high-speed data signals, said plurality of integrated optic directional coupling structures being provided in a cascading tree-type configuration in which the plurality of integrated optic directional coupling structures in each successive level increases by a factor of 2; and
   c) converting said plurality of parallel high-speed data signals into a plurality of slow-speed data signals.

14. The method of claim 13 further comprising the step of comparing said slow-speed data signals with slow-speed reference data.

15. The method of claim 13 further comprising the step of introducing a control signal into each of said plurality of integrated optic directional coupling structures, said control signal having a frequency equivalent to $f/2^i$, where f is the frequency of the high-speed data signal and i is the level of the integrated optic directional coupling structure in the tree-type configuration.

16. The method of claim 15 further comprising:
   a) storing the slow speed signals in a plurality of channels of a first slow speed parallel memory;
   b) storing reference data in a second slow speed parallel memory; and
   c) comparing the first slow speed parallel memory with the second slow speed parallel memory in a slow speed microprocessor-controlled comparator.

17. The method of claim 13 wherein said optical demultiplexing means comprises:
   a) splitting said high-speed signal into a plurality of parallel high-speed data signals having a first pulsewidth by means of a fiber optic splitter;
   b) connecting each of said parallel high-speed data signals to one of a plurality of photodiodes; and
   c) driving one of a plurality AND gates by the output of each of a plurality of said photodiodes, and driving the other input of each of said plurality of AND gates by a gating signal having a second pulsewidth, wherein the pulsewidth of the gating signal is equal to ½ the pulsewidth of the high speed data signals.

18. The method of claim 17 further comprising the step of delaying the gating signal between any two successive AND gates by a delay equal to the bitwidth of the high-speed signal.

19. The method of claim 18 further comprising:
   a) storing the slow speed signals in a plurality of channels of a first slow speed parallel memory;
   b) storing reference data in a second slow speed parallel memory; and
   c) comparing the first slow speed parallel memory with the second slow speed parallel memory in a slow speed microprocessor-controlled comparator.

20. The method of claim 13 wherein said converting step comprises expanding the bitwidth of each of said plurality of parallel high-speed data signals to produce a plurality of parallel slow-speed signals, said plurality of parallel slow-speed signals having a desired bandwidth.

21. The method of claim 20 using a D flip-flop with a reset and an RC network connected between an output of said D flip-flop and an input of said reset to expand the bitwidth of each of said plurality of parallel high-speed data signals, said RC network having an RC constant, wherein the RC constant is approximately equal to the desired bitwidth of said plurality of parallel slow-speed signals.

22. The method of claim 21 further comprising:
   a) storing the slow speed signals in a plurality of channels of a first slow speed parallel memory;
   b) storing reference data in a second slow speed parallel memory; and
   c) comparing the first slow speed parallel memory with the second slow speed parallel memory in a slow speed microprocessor-controlled comparator.

23. The method of claim 13 further comprising the step of comparing said slow speed data signals with slow speed reference data.

24. The method of claim 13 further comprising:
   a) storing the slow speed signals in a plurality of channels of a first slow speed parallel memory;
   b) storing reference data in a second slow speed parallel memory; and
   c) comparing the first slow speed parallel memory with the second slow speed parallel memory in a slow speed microprocessor-controlled comparator.

* * * * *